(12) United States Patent
Moroz et al.

(10) Patent No.: US 10,776,560 B2
(45) Date of Patent: Sep. 15, 2020

(54) MAPPING INTERMEDIATE MATERIAL PROPERTIES TO TARGET PROPERTIES TO SCREEN MATERIALS

(71) Applicant: Synopsys, Inc., Mountain View, CA (US)

(72) Inventors: Victor Moroz, Saratoga, CA (US); Stephen Lee Smith, Mountain View, CA (US); Yong-Seog Oh, Pleasanton, CA (US); Michael C. Shaughnessy-Culver, Napa, CA (US); Jie Liu, San Jose, CA (US); Terry Sylvan Kam-Chiu Ma, Danville, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/691,306

(22) Filed: Nov. 21, 2019

(65) Prior Publication Data
US 2020/0089841 A1    Mar. 19, 2020

Related U.S. Application Data

(63) Continuation of application No. 14/906,543, filed as application No. PCT/US2014/057707 on Sep. 26, 2014, now abandoned.
(Continued)

(51) Int. Cl.
*G06F 17/50* (2006.01)
*G06F 30/398* (2020.01)
(Continued)

(52) U.S. Cl.
CPC .......... *G06F 30/398* (2020.01); *G06F 16/245* (2019.01); *G06F 30/20* (2020.01); *G06F 30/36* (2020.01)

(58) Field of Classification Search
CPC ........ G06F 30/398; G06F 30/36; G06F 30/20; G06F 16/245
(Continued)

(56) References Cited

U.S. PATENT DOCUMENTS

| 5,246,800 A | 9/1993 | Muray |
| 5,472,814 A | 12/1995 | Lin |

(Continued)

FOREIGN PATENT DOCUMENTS

| WO | 00-72185 A2 | 11/2000 |
| WO | 01-08028 A2 | 2/2001 |
| WO | 02-058158 A2 | 7/2002 |

OTHER PUBLICATIONS

Ayyadi et al., Semiconductor Simulations Using a Coupled Quantum Drift-Diffusion Schrodinger-Poisson Model, Aug. 12, 2004, Vienna University of Technology, pp. 1-19.
(Continued)

*Primary Examiner* — Jack Chiang
*Assistant Examiner* — Brandon Bowers
(74) *Attorney, Agent, or Firm* — Haynes Beffel & Wolfeld LLP; Warren S. Wolfeld; Andrew L. Dunlap

(57) ABSTRACT

A system for evaluating candidate materials for fabrication of integrated circuits includes a data processor coupled to a memory. Roughly described, the data processor is configured to: calculate and write to a first database, for each of a plurality of candidate materials, values for each property in a set of intermediate properties; calculate and write to a second database, values for a selected target property for various combinations of values for the intermediate properties and values describing candidate environments; and for a particular candidate material and a particular environment in combination, determine values for the intermediate properties for the candidate material by reference to the first
(Continued)

database, and determine the value of the target property for the candidate material by querying the second database with, in combination, (1) the determined intermediate property values of the candidate material and (2) a value or values describing the particular environment.

15 Claims, 4 Drawing Sheets

Related U.S. Application Data

(60) Provisional application No. 61/891,339, filed on Oct. 15, 2013, provisional application No. 61/883,942, filed on Sep. 27, 2013, provisional application No. 61/883,158, filed on Sep. 26, 2013.

(51) Int. Cl.
  *G06F 16/245* (2019.01)
  *G06F 30/20* (2020.01)
  *G06F 30/36* (2020.01)

(58) Field of Classification Search
  USPC .......................................................... 716/136
  See application file for complete search history.

(56) References Cited

U.S. PATENT DOCUMENTS

| | | | |
|---|---|---|---|
| 5,702,847 | A | 12/1997 | Tarumoto et al. |
| 6,057,063 | A | 5/2000 | Liebmann et al. |
| 6,096,458 | A | 8/2000 | Hibbs |
| 6,685,772 | B2 | 2/2004 | Goddard, III et al. |
| 7,448,022 | B1 | 11/2008 | Ram et al. |
| 7,756,687 | B2 | 7/2010 | Hwang et al. |
| 8,082,130 | B2 | 12/2011 | Guo et al. |
| 8,112,231 | B2 | 2/2012 | Samukawa |
| 8,434,084 | B2 | 4/2013 | Ferdous et al. |
| 8,453,102 | B1 | 5/2013 | Pack et al. |
| 8,454,748 | B2 | 6/2013 | Iwaki et al. |
| 8,555,281 | B1 | 10/2013 | van Dijk et al. |
| 8,572,523 | B2 * | 10/2013 | Tuncer ............... G06F 30/39 716/55 |
| 8,626,480 | B2 * | 1/2014 | Chang ............... G06F 30/33 703/14 |
| 8,871,670 | B2 | 10/2014 | Seebauer |
| 9,727,675 | B2 | 8/2017 | Liu et al. |
| 9,922,164 | B2 | 3/2018 | Chennamsetty et al. |
| 9,983,979 | B1 | 5/2018 | Dolinsky et al. |
| 2002/0142495 | A1 | 10/2002 | Usujima |
| 2003/0217341 | A1 | 11/2003 | Rajsuman et al. |
| 2003/0217343 | A1 | 11/2003 | Rajsuman et al. |
| 2004/0063225 | A1 | 4/2004 | Borden et al. |
| 2004/0067355 | A1 | 4/2004 | Yadav et al. |
| 2004/0107056 | A1 | 6/2004 | Doerksen et al. |
| 2005/0170379 | A1 | 8/2005 | Kita et al. |
| 2005/0223633 | A1 | 10/2005 | Sankaranarayanan |
| 2005/0278124 | A1 | 12/2005 | Duffy et al. |
| 2005/0281086 | A1 | 12/2005 | Kobayashi et al. |
| 2006/0038171 | A1 | 2/2006 | Hasumi et al. |
| 2006/0101378 | A1 | 5/2006 | Kennedy et al. |
| 2006/0271301 | A1 | 11/2006 | Takada et al. |
| 2007/0177437 | A1 | 8/2007 | Guo |
| 2007/0185695 | A1 | 8/2007 | Neumann |
| 2007/0265725 | A1 | 11/2007 | Liu et al. |
| 2008/0052646 | A1 | 2/2008 | Tuncer et al. |
| 2008/0147360 | A1 | 6/2008 | Fejes et al. |
| 2009/0032910 | A1 | 2/2009 | Ahn et al. |
| 2010/0052180 | A1 | 3/2010 | Nguyen Hoang et al. |
| 2010/0070938 | A1 | 3/2010 | Wang et al. |
| 2010/0318331 | A1 | 12/2010 | Ritchie |
| 2011/0131017 | A1 | 6/2011 | Cheng et al. |
| 2011/0161361 | A1 | 6/2011 | Csanyi et al. |
| 2011/0231804 | A1 | 9/2011 | Liu et al. |
| 2011/0246998 | A1 | 10/2011 | Vaidya et al. |
| 2011/0313741 | A1 | 12/2011 | Langhoff |
| 2011/0313748 | A1 | 12/2011 | Li |
| 2012/0228615 | A1 | 9/2012 | Uochi |
| 2012/0232685 | A1 | 9/2012 | Wang et al. |
| 2013/0139121 | A1 | 5/2013 | Wu et al. |
| 2014/0180645 | A1 | 6/2014 | Lee et al. |
| 2014/0251204 | A1 | 9/2014 | Najmaei et al. |
| 2015/0088473 | A1 | 3/2015 | Liu et al. |
| 2015/0088481 | A1 | 3/2015 | Liu et al. |
| 2015/0089511 | A1 | 3/2015 | Smith et al. |
| 2015/0120259 | A1 | 4/2015 | Klimeck et al. |
| 2016/0171139 | A1 | 6/2016 | Tago et al. |
| 2016/0335381 | A1 | 11/2016 | Liu et al. |
| 2019/0362042 | A1 | 11/2019 | Oh et al. |

OTHER PUBLICATIONS

Kresse, G., el al., VASP the Guide (Sep. 9, 2013), pp. 203.
U.S. Appl. No. 15/024,009—Final Office Action dated Nov. 18, 2016, 24 pages.
U.S. Appl. No. 15/081,735—Office Action dated Dec. 13, 2016, 30 pages.
PCT/US2014/057840—International Preliminary Report on Patentability dated Mar. 29, 2016, 5 pages.
U.S. Appl. No. 15/081,735—Response to Office Action dated Jun. 15, 2016 filed Nov. 15, 2016, 18 pages.
PCT/US2014/057803—International Search Report and Written Opinion dated Nov. 28, 2014, 14 pages.
U.S. Appl. No. 15/024,009—Office Action dated Jul. 21, 2016, 24 pages.
U.S. Appl. No. 15/024,009—Response to Office Action dated Jul. 21, 2016 filed Nov. 1, 2016, 38 pages.
U.S. Appl. No. 15/024,009—Preliminary Amendment filed Mar. 22, 2016, 9 pages.
Martin-Bragado et al., "Modeling charged defects, dopant diffusion and activation mechanisms for TCAD simulations using Kinetic Monte Carlos," Nuclear Instruments and Methods in Physics Research Section B: Beam Interactions with Materials and Atoms, 253:1, 18 pages, Dec. 2006.
Nagel, Laurence W., "SPICE2: A Computer Program to Simulate Semiconductor Circuits", Memorandum No. UCB/ERL-M520, Electronics Research Laboratory, College of Engineering, University of California, Berkeley, CA USA, (May 9, 1975), 431 pages.
Synopsys, Sentaurus TCAD, Industry-Standard Process and Device Simulators, Datasheet (2012), 4 pages.
Yip, S. (ed.), Handbook of Materials Modeling, 565-588. c 2005 Springer.
U.S. Appl. No. 14/497,681—Response to Office Action dated Aug. 25, 2016 filed Jan. 24, 2017, 10 pages.
U.S. Appl. No. 14/906,543—Response to Office Action dated Jun. 17, 2016 filed Dec. 19, 2016, 23 pages.
U.S. Appl. No. 14/906,543—Final Office Action dated Feb. 10, 2017, 16 pages.
U.S. Appl. No. 14/906,543—Preliminary Amendment dated Jan. 20, 2016, 8 pages.
U.S. Appl. No. 15/081,735—Response to Office Action dated Dec. 13, 2016, filed Mar. 13, 2017, 10 pages.
Lee et al., "Area and Volume Measurements of Objects with Irregular Shapes Using Multiple Silhouettes," Optical Engineering 45(2), Feb. 2006, 11 pages.
Keneti, et al., "Determination of Volume and Centroid of Irregular Blocks by a Simplex Integration Approach for Use in Discontinuous Numerical Methods," Geomechanics and Geoengineering: An International Journal, vol. 3, No. 1, Mar. 2008, pp. 79-84.
U.S. Appl. No. 15/081,735—Notice of Allowance dated Mar. 29, 2017, 17 pages.
U.S. Appl. No. 14/497,681—Final Office Action dated May 3, 2017, 28 pages.
Isik, A., "Molecular Dynamics Simulation of Silicon Using Empirical Tight-Binding Method," Massachusetts Institute of Technology, Jan. 1992, 89 pages.

(56) References Cited

OTHER PUBLICATIONS

Miloszewski, J., "Simulations of Semiconductor Laser Using Non-equilibrium Green's Functions Method," University of Waterloo, 2012, 129 pages.

U.S. Appl. No. 15/024,009—Response to Final Office Action dated Nov. 18, 2016 filed Mar. 20, 2017, 24 pages.

Jegert, et al. "Role of Defect Relaxation for Trap-Assisted Tunneling in High-k Thin Films: A First-Principles Kinetic Monte Carlo Study." Physical Review B 85.4 (2012), 8 pages.

U.S. Appl. No. 14/497,695—Office Action dated Jul. 13, 2017, 26 pages.

U.S. Appl. No. 14/498,492—Notice of Allowance dated Aug. 14, 2017, 28 pages.

Clark, "Quantum Mechanics: Density Functional Theory and Practical Application to Alloys." Introduction to Compter Simulation (2010), 51 pages.

U.S. Appl. No. 14/906,543—Response to Final Office Action dated Feb. 10, 2017 filed Jun. 23, 2017, 15 pages.

U.S. Appl. No. 14/906,543—Advisory Action dated Aug. 2, 2017, 4 pages.

U.S. Appl. No. 14/498,458—Notice of Allowance dated Sep. 7, 2017, 29 pages.

U.S. Appl. No. 15/669,722—Office Action dated Oct. 6, 2017, 30 pages.

U.S. Appl. No. 14/497,681—Response to Final Office Action dated May 3, 2017 filed Nov. 3, 2017, 13 pages.

U.S. Appl. No. 14/497,681—Office Action dated Dec. 20, 2017, 25 pages.

U.S. Appl. No. 15/669,722—Notice of Allowance dated Mar. 7, 2018, 5 pages.

U.S. Appl. No. 15/669,722—Response to Office Action dated Oct. 6, 2017 filed Jan. 10, 2018, 3 pages.

U.S. Appl. No. 14/497,681—Response to Office Action dated Dec. 20, 2017 filed Mar. 20, 2018, 11 pages.

U.S. Appl. No. 14/497,695—Final Office Action dated May 3, 2018, 14 pages.

U.S. Appl. No. 14/497,695—Response to Office Action dated Jul. 13, 2017 filed Jan. 16, 2018, 19 pages.

U.S. Appl. No. 15/021,655—Office Action dated Apr. 19, 2018, 43 pages.

U.S. Appl. No. 14/497,681—Final Office Action dated May 11, 2018, 19 pages.

U.S. Appl. No. 14/497,681—Advisory Action dated Aug. 3, 2018, 7 pages.

Bortolossi, "3D Finite Element Drift-Diffusion Simulation of Semiconductor Devices," Jul. 25, 2014, Politecnico di Milano, 132 pages.

Taylor et al., "Ab initio modeling of quantum transport properties of molecular electronic devices", 2001, Physical Review B 63.24, 245407, pp. 1-13.

Sverdlov et al., "Current Transport Models for Nanoscale Semiconductor Devices," 2008, Materials Science and Engineering: R: Reports 58.6, pp. 228-270.

U.S. Appl. No. 15/224,165—Office Action dated Aug. 7, 2018, 47 pages.

U.S. Appl. No. 14/497,695—Advisory Action dated Aug. 23, 2018, 3 pages.

U.S. Appl. No. 14/497,695—Response to Final Office Action dated May 3, 2018 filed Aug. 29, 2018, 31 pages.

U.S. Appl. No. 14/497,681—Office Action dated Sep. 5, 2018, 22 pages.

U.S. Appl. No. 14/497,695—Office Action dated Sep. 21, 2018, 18 pages.

U.S. Appl. No. 15/021,655—Notice of Allowance dated Nov. 7, 2018, 13 pages.

U.S. Appl. No. 15/021,655—Response to Office Action dated Apr. 19, 2018 filed Jul. 18, 2018, 17 pages.

U.S. Appl. No. 15/224,165—Response to Office Action dated Aug. 7, 2018 filed Dec. 4, 2018, 14 pages.

U.S. Appl. No. 14/497,695—Response to Office Action dated Sep. 21, 2018 filed Jan. 22, 2019, 15 pages.

U.S. Appl. No. 14/497,681—Response to Final Office Action dated May 11, 2018 filed Jul. 13, 2018, 12 pages.

U.S. Appl. No. 14/497,681—Response to Office Action dated Sep. 5, 2018 filed Dec. 5, 2018, 11 pages.

U.S. Appl. No. 14/497,681—Final Office Action dated Feb. 7, 2019, 23 pages.

U.S. Appl. No. 15/224,165—Final Office Action dated Feb. 6, 2019, 14 pages.

U.S. Appl. No. 14/497,695—Notice of Allowance dated May 13, 2019, 10 pages.

PCT/US2014/057803—International Preliminary Report on Patentability dated Mar. 29, 2016, 10 pages.

U.S. Appl. No. 14/497,681—Response to Final Office Action dated Feb. 7, 2019, as filed Jun. 6, 2019, 9 pages.

Capelle, "A Bird's-Eye View of Density-Functional Theory", Departamento de Fisica e Informatica Instituto de Fisica de Sao Carlos, Universidade de Sao Paulo, Caixa Postal 369, Sao Carlos, 13560-970 SP, Brazil, arXiv:cond-mat/0211443v5 [cond-mat.mtrl-sci], Nov. 18, 2006, pp. 1-69.

U.S. Appl. No. 14/497,695—Amendment After Allowance filed Jun. 11, 2019, 8 pages.

U.S. Appl. No. 15/021,655—Notice of Allowance dated May 1, 2019, 12 pages.

U.S. Appl. No. 15/224,165—Response to Final Office Action dated Feb. 6, 2019 filed Jun. 13, 2019, 13 pages.

U.S. Appl. No. 15/224,165—Advisory Action dated Jun. 27, 2019, 4 pages.

U.S. Appl. No. 14/497,681—Notice of Allowance dated Jul. 25, 2019, 22 pages.

U.S. Appl. No. 15/861,605—Office Action dated Aug. 2, 2019, 32 pages.

U.S. Appl. No. 14/497,695—Amendment with RCE filed Aug. 6, 2019, 8 pages.

U.S. Appl. No. 14/497,695—Notice of Allowance dated Aug. 14, 2019, 11 pages.

U.S. Appl. No. 15/224,165—Final Office Action dated Sep. 20, 2019, 22 pages.

Pomorski et al., "Capacitance, induced charges, and bound states of biased carbon nanotube systems," 2004, Physical Review B 69.11, 115418, pp. 1-16.

Zhu et al., "Time-dependent quantum transport: Direct analysis in the time domain," 2005, Physical Review B 71.7:075317, pp. 1-10.

U.S. Appl. No. 15/224,165—Response to Final Office Action dated Sep. 20, 2019 filed Dec. 16, 2019, 10 pages.

PCT/US2014/057637—International Search Report and Written Opinion dated Jan. 5, 2015, 12 pages.

Wang, Yan, "Multiscale Simulations", Georgia Institute of Technology, available at http://www-old.me.gatech.edu/~ywang/CANE/lect05_MultiscaleSims_yanwang.pdf, (dated May 14-16, 2012), 40 pages.

Braunstein, Rubin, et al., "Intrinsic Optical Absorption in Germanium-Silicon Alloys", Physical Review, vol. 109, No. 3, (Feb. 1, 1958), pp. 695-710.

Sant, Saurabh, et al., "Band gap bowing and band offsets in relaxed and strained Si1-xGex alloys by employing a new nonlinear interpolation scheme", published online Jan. 18, 2013, Journal of Applied Physics, vol. 113, pp. 033708-1 through 033708-10.

Uppal, S., et al., "Diffusion of boron in germanium at 800-900° C.", Journal of Applied Physics, vol. 96, No. 3, (Aug. 1, 2004), pp. 1376-1380.

Haddara, Y.M., et al., "Accurate measurements of the intrinsic diffusivities of boron and phosphorus in silicon", Applied Physics Letters, vol. 77, No. 13, (Sep. 25, 2000), pp. 1976-1978.

Uppal, S., et al., "Diffusion of ion-implanted boron in germanium", Journal of Applied Physics, vol. 90, No. 8, (Oct. 2001), 4293-4295.

Stadler, J., et al., "IMD: a Software Package for Molecular Dynamics Studies on Parallel Computers", International Journal of Modren Physics C, vol. 8, No. 5, (Oct. 1997), pp. 1131-1140.

Refson, Keith, "Moldy: a portable molecular dynamics simulation program for serial and parallel computers", Computer Physics Communications, vol. 126, issue 3, (Apr. 11, 2000), pp. 310-329.

(56) References Cited

OTHER PUBLICATIONS

Smith, W., et al., "DL_POLY: Application to molecular simulation", Molecular Simulation, vol. 28, Issue 5, (May 5, 2002), pp. 385-471.
Smith, W., and Forester, T.R., "DL_POLY_2.0: A general-purpose parallel molecular dynamics simulation package", Journal of Molecular Graphics, vol. 14, Issue 3, (Jun. 1996), pp. 136-141.
Nieminen, Risto M., "From atomistic simulation towards multiscale modelling of materials", J. Phys.: Condens. Matter, (published Mar. 8, 2002), vol. 14, pp. 2859-2876.
"Simulation of Random Dopant Fluctuation Effects in TCAD Sentaurus", TCAD News, Dec. 2009, Synopsys, Mountain View, CA, USA, 4 pages.
Yu, P.Y., and Cardona, M., "2. Electronic Band Structures", Fundamentals of Seminconductors, Graduate Texts in Physics, 4th ed., Springer-Verlag Berlin Heidelberg, (2010), pp. 17-106.
"ITRS, International Technology Roadmap for Semiconductors, 2012 Update", (2012), available at http://www.itrs.net/Links/2012ITRS/2012Chapters/2012Overview.pdf, 76 pages.
"Sentaurus TCAD" datasheet, Synopsys, Inc., Mountain View, CA USA, May 2012, 4 pages.
"ITRS, 2012 Overall Roadmap Technology Characteristics (ORTC) Tables", International Technology Roadmap for Semiconductors, 2012, availalbe at http://www.itrs.net/Links/2012ITRS/2012Tables/ORTC_2012Tables.xlsm, visited Oct. 14, 2013, 39 pages.
Hansen, Stephen E., "SUPREM-III User's Manual, Version 8628", (Aug. 1986), available from http://www-tcad.stanford.edu/tcad/programs/suprem3man.pdf, visited Oct. 14, 2013, 186 pages.
"Sentaurus Device" datasheet, Synopsys, Inc., Mountain View, CA, USA, Feb. 2007, 8 pages.
Dunham, Scott T., "A Quantitative Model for the Coupled Diffusion of Phosphorus and Point Defects in Silicon", J. Electrochem. Soc., vol. 139, No. 9, (Sep. 1992), pp. 2628-2636.
Skinner, Richard D., editor, "Basic Integrated Circuit Manufacturing", section 2 of "Technology Reference Manual", ICE, Integrated Circuit Engineering, (1993), 112 pages.
Nagel, et al., "Spice (Simulation Program with Integrated Circuit Emphasis)", Memorandum No. ERL-M382, Electronics Research Laboratory, College of engineering, University of California, Berkeley, CA USA, (Apr. 12, 1973), 65 pages.
Quarles, Thomas Linwood, "Analysis of Performance and Convergence Issues for Circuit Simulation", Memorandum No. UCB/ERL M89/42, Electronics Research Laboratory, College of Engineering, University of California, Berkeley, CA USA, (Apr. 1989), 142 pages.
Dunga, Mohan V., et al., "BSIM4.6.0 MOSFET Model—User's Manual", Department of Electrical Engineering and Computer Sciences, University of California, Berkeley, CA USA, 2006, 201 pages.
Burke, Kieron, and friends, "The ABC of DFT", Department of Chemistry, University of California, Irvine, CA, (Apr. 10, 2007), available at http://chem.ps.uci.edu/~kieron/dft/book/, 104 pages.
Luisier, Mathieu, "Quantum Transport Beyond the Effective Mass Approximation", Diss. ETH No. 17016, 2007, 150 pages.
Taur, Y., "CMOS design near the limit of scaling", IBM J. Res. & Dev., vol. 46, No. 2/3, Mar./May 2002, pp. 213-212.
Luisier, Mathieu, "Quantum Transport for Engineers Lecture 4: Wave Function (WF) formalism and electrostatics", Integrated Systems Laboratory, ETH Zurich (2012), 34 pages.
Kim, Kyoung-Youm and Lee, Byoungho, "Quantum transport modeling in anisotropic semiconductors using Wigner function formulation", Proceedings Conference on Optoelectronic and Microelectronic Materials and Devices, COMMAD 2000. (2000), pp. 4.
Arovas, Daniel "Lecture Notes on Condensed Matter Physics, Chapter 1 Boltzmann Transport", Department of Physics, University of California, San Diego (2010), pp. 46.
Grau-Crespo, R. "Electronic structure and magnetic coupling in FeSbO4: A DFT study using hybrid functionals and GGA+U methods", Physical Review B 73, (2006), pp. 9.
Côté, Michel, "Introduction to DFT+U", International Summer School on Numerical Methods for Correlated Systems in Condensed Matter, Universite de Montreal, (May 26 to Jun. 6, 2008), pp. 23.
Muramatsu, A., "Quantum Monte Carlo for lattice fermions", in: M.P. Nightingale, C.J. Umriga (Eds.), Proceedings of the NATO Advanced Study Institute on Quantum Monte Carlo Methods in Physics and Chemistry, Kluwer Academic Publishers, (1999), pp. 32.
Gross, E.K.U. and Maitra, N.T., "Introduction to TDDFT", Chapter in Fundamentals of Time-Dependent Density Functional Theory, Springer-Verlag (2012), 58 pages.
Marques, M.A.L. and Gross, E.K.U., "Time-dependent density functional theory," C. Fiolhais, F. Nogueira, M.A.L. Marques (Eds.), A Primer in Density Functional Theory, Springer Lecture Notes in Physics, vol. 620, Springer (2003), pp. 144-184.
Ryndyk, D.A., "Tight-binding model", Lectures 2006-2007, Dresden University of Technology, (2006-2007), pp. 26-30.
Bank, R.E., "Numerical Methods for Semiconductor Device Simulation", IEEE Transactions on Electron Devices, vol. ED-30, No. 9, (1983), pp. 1031-1041.
Lee, J.F., "Time-Domain Finite-Element Methods", IEEE Transactions on Antenna and Propagation, vol. 45, No. 3, (1997), pp. 430-442.
Eymard, R., "Finite Volume Methods", course at the University of Wroclaw, (2008), manuscript update of the preprint 'n0 97-19 du LATP, UMR 6632, Marseille, (Sep. 1997), Handbook of Numerical Anaylsis P.G. Ciarlet, J.L. Lions, eds. vol. 7, pp. 713-1020.
Chen, X.L., "An advanced 3D boundary element method for characterizations of composite materials", Engineering Analysis with Boundary Elements 29, (2005), pp. 513-523.
Marx, D., "Ab initio molecular dynamics: Theory and Implementation", Modern Methods and Algorithms of Quantum Chemistry, J. Grotendorst (Ed.), John von Neumann Institute for Computing, Julich, NIC Series, vol. 1, (2000), pp. 150.
Kresse, Georg, et al., "VASP the Guide",http://cms_mpi.univie.ac.atNASP, Sep. 9, 2013, Vienna, Austria, pp. 1-203.
PCT/US2014/057707—International Search Report and Wirtten Opinion dated Dec. 29, 2014, 16 pages.
PCT/US2014/057707—International Preliminary report on Patentability, Apr. 29, 2016, 8 pages.
PCT/US2014/057637—International Preliminary Report on Patentability dated Mar. 29, 2016, 7 pages.
U.S. Appl. No. 14/906,543—Office Action dated Jun. 17, 2016, 26 pages.
PCT/US2014/057840—International Search Report dated Nov. 28, 2014, 9 pages.
U.S. Appl. No. 15/081,735—Office Action dated Jun. 15, 2016, 16 pages.
Saha et al., Technology CAD: Technology Modeling, Device Design and Simulation, 2004 VLSI Design Tutorial, Mubai, India, Jan. 5, 2004, 227 pages.
U.S. Appl. No. 14/497,681—Office Action dated Aug. 25, 2016, 20 pages.

\* cited by examiner

MAPPING INTERMEDIATE MATERIAL PROPERTIES TO TARGET PROPERTIES TO SCREEN MATERIALS

REFERENCE TO OTHER APPLICATIONS

This application is a Continuation of U.S. application Ser. No. 14/906,543, filed 20 Jan. 2016, which application is a U.S. National Stage of International Application No. PCT/US2014/057707, filed 26 Sep. 2014, which application claims the benefit under 35 U.S.C. 119 of the following U.S. provisional applications:
U.S. Provisional Application No. 61/883,158, filed 26 Sep. 2013;
U.S. Provisional Application No. 61/883,942, filed 27 Sep. 2013; and
U.S. Provisional Application No. 61/891,339 filed 15 Oct. 2013.
All the above applications are incorporated by reference as if fully set forth herein. In addition, U.S. Non-Provisional patent application Ser. No. 14/497,695 filed on 26 Sep. 2014, entitled "Characterizing Target Material Properties Based On Properties Of Similar Materials", by inventors Moroz, Smith, Oh, Liu, Shaughnessy-Culver and Ma, is also incorporated by reference as if fully set forth herein.

BACKGROUND

This invention relates to methods for evaluating candidate materials for fabrication of integrated circuits in computer aided design (CAD) and electronic design automation (EDA) systems.

DESCRIPTION OF RELATED ART

The semiconductor industry has been steadily widening the number of materials that are used to manufacture the integrated circuits. The transition from planar transistors to FinFETs is further accelerating and widening the search. There are several different classes of materials of interest with very different desirable properties. For example, material for the transistor's channel should satisfy at least the following criteria:
Provide high carrier mobility
Provide consistent behavior from one transistor to the next, with small random variability
Provide large enough bandgap to prevent band-to-band tunneling off-state leakage
Provide small enough bandgap with high Density Of States (DOS) to ensure large number of carriers in the channel for the on-state biasing conditions
Provide low enough effective carrier mass to ensure high on-state current
Provide high enough effective carrier mass to ensure low off-state current due to the direct source-to-drain tunneling
Provide crystal lattice size that is compatible with the adjacent materials and enables stress engineering
Provide high enough mechanical strength to prevent dislocations and cracking
Provide low enough mechanical strength to enable straining the channel by the adjacent materials for stress engineering
Provide the ability to introduce dopants to control the conductivity and threshold voltage
The dopants should have shallow enough energy levels in the bandgap to prevent incomplete ionization at low temperatures
Provide low enough defect density to avoid excessive carrier recombination that degrades the transistor performance
Provide high enough defect density to quickly remove unintentional carriers generated by radiation (i.e. Single Event Upset (SEU)) or cross-talk with the adjacent transistors or Electro-Static Discharge (ESD)
Provide low enough density of dangling bonds at the interface with the gate dielectric to reduce carrier scattering and carrier trapping that degrade transistor performance
Provide sufficient bonding strength to the gate dielectric to prevent delamination
Provide consistent layer/film/wire size from one transistor to the next to ensure reproducible transistor behavior
Provide low enough interface roughness with the gate dielectric to reduce carrier surface scattering in narrow layers/films/wires and therefore high conductance
Provide workfunction that is compatible with the other key materials in the transistor: high enough barrier to the gate dielectric, within the range of gate workfunction to set desired threshold voltages, and low enough barrier to the source and drain materials
Provide breakdown voltage that is at least 20% higher than the highest power supply voltage on the chip, which is usually 2.5 V for the input/output circuit
Stable mechanically and chemically within the desired temperature range and ambient conditions to prevent degradation of transistor behavior over time
Provide the ability to be etched with acceptable chemistry and timeframe for patterning blanket films into transistors
Provide the ability to be selectively grown/deposited on top of the patterned wafer
Provide the thermal stability that is compatible with the other materials on the same wafer, including channel materials for the n-type and p-type transistors in the Front End Of Line process (FEOL), and including the interconnects in the Back End Of Line process (BEOL)
Provide comparable performance to the other type of transistor on the same chip (e.g. the performances of n-type and p-type transistors should be comparable for efficient circuit design)
Provide thermal properties that enable sufficient removal of the Joule heat generated during transistor operation
Beat silicon and other competing candidates in terms of on-state performance, off-state leakage, scalability for the target technology nodes, manufacturing yield, reliability during the target transistor lifetime and environment conditions, material cost, and manufacturing cost One of the critical properties of a transistor is the off-state leakage. The off-state leakage is determined by the following major mechanisms:
1. Drain-Induced Barrier Lowering (DIBL)
2. Gate-Induced Drain Leakage (GIDL)
3. Band-To-Band Tunneling (BTBT)
4. Direct Source-to-Drain Tunneling (DSDT)

The first two mechanisms can be controlled by careful design of the transistor. For example, FinFETs have much better (lower) DIBL effect compared to the planar MOSFETs. The amount of GIDL can be controlled by adjusting the drain/gate overlap/underlap in the locations with the strongest gate field. See, for example, U.S. Provisional Application Ser. No. 13/193,320, filed Jul. 28, 2011, incorporated by reference herein.

The two latter mechanisms are determined mainly by the bandstructure of the channel material. The narrower the bandgap and the lower the effective tunneling mass of the charge carriers in the channel material, the worse are the BTBT and DSDT leakage currents.

Currently, the amount of leakage for a particular channel material is characterized either experimentally or by a series of advanced modeling techniques, such as a combination of DFT and TCAD. This process can be cumbersome and time consuming.

SUMMARY

What makes the modeling task especially complex is that the band structure of the channel material changes significantly with the scaling of the fin width and height, and also with the stress engineering. This means that the material properties have to be re-evaluated every time the transistor geometry or stress are adjusted. A fast evaluation of the material-determined leakage mechanisms for a particular FinFET or nano-wire transistor is highly desirable.

According to the invention, roughly described, a system is provided for quick screening of potential channel materials in terms of the off-state leakage. The system performs two major tasks:
1. Estimation of the key parameters of the bandstructure, such as the bandgap Eg, the effective mass $m^*$, and whether it is a direct or indirect bandgap material for the given fin sizes and for the given stress pattern.
2. Estimation of the amount of BTBT and DSDT leakage currents for a given set of transistor design rules.

Task #1 is achieved by pre-calculating relevant properties of the reference materials for several representative fin sizes and stress patterns. This data is used to obtain the properties of specific material composition for specific fin sizes and specific stress patterns.

Task #2 is achieved by pre-calculating the BTBT and DSDT leakage currents for the given FinFET/nano-wire design rules and representative bandstructure properties. This data is used in combination with #1 to obtain the estimate of the off-state leakage currents for the particular material and the particular transistor design rules.

DETAILED DESCRIPTION

Figure 1:
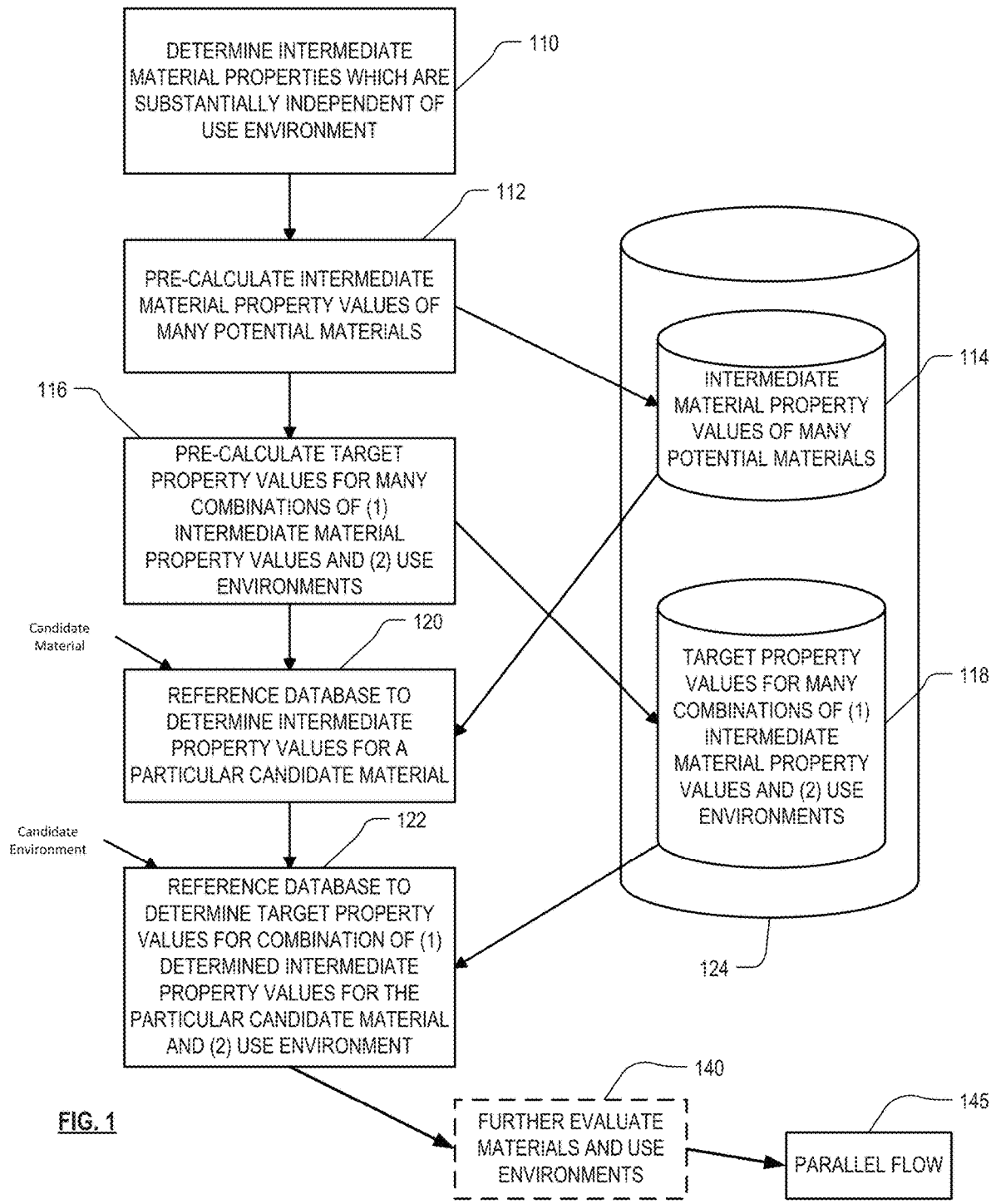
FIG. 1 is a flow chart illustrating logic of an overall methodology incorporating aspects of the invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The methodology includes the following steps:
a. Pre-calculate in DFT relevant band structure properties such as Eg and $m^*$ for a large number of materials that are potential candidates for the channel of a transistor. This can take many days of computations per material.
b. Pre-calculate in TCAD the BTBT and DSDT leakage currents for a large number of given material properties such as Eg and $m^*$ for several target sets of design rules (say, for 10 nm technology node FinFETs, 7 nm technology node FinFETs, and 5 nm technology node nano-wire transistors). This may take hours of computation per material/design rules combination.
c. For a particular candidate material, extract its key band structure properties such as Eg and $m^*$ based on the results pre-calculated in (a). If the properties of particular candidate material are not characterized directly in (a), then use smart evaluation of the properties based on several similar materials that are pre-characterized in (a). This should take seconds to evaluate. Some examples of smart evaluation techniques that can be used for not-yet-characterized materials are set forth in U.S. Provisional Application No. 61/889,444, filed Oct. 10, 2013, incorporated by reference herein.
d. For a particular candidate material with properties evaluated in (c), and for a particular design rules, use results pre-calculated in (b) to estimate the BTBT and DSDT leakage currents. This should take seconds to evaluate.

The (a) and (b) steps are done in advance, and the (c) and (d) steps are done every time a new combination of a candidate material and design rules is required. Considering that steps (c) and (d) are very fast, the screening can be done quickly. Whenever new potential materials and design rules emerge, the steps (a) and (b) can be repeated to extend the material and design space. As used herein, a "combination" of candidate material and the design rules differs from another "combination" of candidate material and the design rules, if one or the other or both of the candidate material and the design rules differ.

This methodology enables fast screening of the combination of the channel material and the design rules in terms of the off-state current to see if that combination can meet the leakage budget of the mobile chip (Low Power (LP) or Standard Process (SP) or High Performance (HP).

Besides the channel material properties, this methodology can be used to screen source and drain candidate materials, the type and amount of stress engineering, gate stack leakage, and other key factors that affect off-state leakage.

It can also be used to screen the combinations of material properties and design rules in terms of other transistor figures of merit, such as the driving current strength, switching speed, capacitance, reliability, variability, power consumption, etc.

FIG. 1 is a flow chart illustrating logic of an overall methodology incorporating aspects of the invention. The logic can be implemented using processors programmed using computer programs stored in memory accessible to the computer systems and executable by the processors, by dedicated logic hardware, including field programmable integrated circuits, or by combinations of dedicated logic hardware and computer programs. As with all flowcharts herein, it will be appreciated that many of the steps can be combined, pipelined, performed in parallel, or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that a particular embodiment of the invention may perform numerous additional steps for accomplishing other functions, and those steps may be performed before, during, after or between those shown herein.

The methodology is for determining or predicting one or more "target" material properties for several candidate materials, or several use environments, or both, under evaluation. For example, the target material properties may include leakage current if the material were used as a transistor channel material, and the use environments may include channel lengths, stress situations, etc. Roughly, the determination is divided into (a) a determination of intermediate property values which are substantially independent of use environment, and (b) a determination of the target material property values based on known or predicted intermediate property values and a candidate use environment.

In step 110, one or more intermediate material properties are identified. Preferably these are material properties which affect the value of the target properties, and are substantially independent of the use environment. Advantageously they are material properties which also are costly (difficult or time consuming) to calculate, but which render the calculation of the target material property values significantly less costly to calculate. In an embodiment, the intermediate properties are $E_g$ and $m^*$.

In step 112, the intermediate material property values are calculated for a large number of potential materials (though in one embodiment they could be calculated for as few as one or two potential materials). In this context, two materials are considered "different" if their composition is different. For example, two different pure materials (e.g. Si and Ge) are considered "different". Two different alloys of a single pair or set of materials (e.g. $Si_{0.25}Ge_{0.75}$ and $Si_{0.5}Ge_{0.5}$) are also considered "different". Amorphous and crystalline Si are considered also "different", and so on. The intermediate material property values are written into a database 114, each in association with an identification of its corresponding material.

In step 116, the target property values are calculated for a large number of combinations of (1) intermediate material property values and (2) use environments (though in one embodiment the number of combinations can be as few as one or two). In an embodiment, the target property values are the BTBT and DSDT leakage currents, and the use environments may involve selected aspects of the design rules of a technology node. Technology nodes are defined at http (colon slash slash) www (dot) itrs (dot) net/, for example in ITRS, International Technology Roadmap For Semiconductors—2012 Update Overview (2012), available at http (colon slash slash) www (dot) itrs (dot) net/Links/2012ITRS/2012Chapters/2012Overview.pdf, and in ITRS, 2012 Overall Roadmap Technology Characteristics (ORTC) Tables (2012, available at http (colon slash slash) www (dot) itrs (dot) net/Links/2012ITRS/2012Tables/ORTC_2012Tables.xlsm, both visited 14 Oct. 2013 and both incorporated herein by reference. The intermediate property values need not exactly match intermediate property values that are represented in the database 114, though it is preferable that some or all do match. Also, depending on the goal, some of the intermediate properties represented in database 114 may not be needed at all for calculating the target property values. In that case the unneeded intermediate properties need not be varied in the combinations considered in step 116.

The pre-calculated target property values are stored in a database 118 which relates them to the combinations from which they were calculated. In one embodiment, the database can be organized as a matrix (possibly an N-dimensional matrix which may be sparse), in which the dimensions represent the values of the intermediate material properties as well as values of various parameters describing the use environment, and in which each cell identifies the pre-calculated target property value(s) for the identified material and use environment. In an environment in which only one parameter is varied in the combinations considered in step 116, the matrix may have only one dimension (i.e. a vector).

Once the databases 114 and 118 are prepared (or partially prepared), then they can be used to significantly accelerate the preliminary evaluation of candidate materials. In step 120, the intermediate property values for a particular candidate material are determined by look-up from the database 114, given the candidate material. If the exact material has not been characterized in the database 114, then two or more similar materials can be looked up in the database 114, and their pre-calculated intermediate property values can be combined to predict the intermediate property values of the particular candidate material. In one embodiment, the combination of intermediate property values can involve interpolation. In another embodiment, the intermediate property values can involve a more complex or intelligent mechanism as described in the above-incorporated U.S. Provisional Application No. 61/889,444, filed Oct. 10, 2013.

In step 122, the intermediate property values obtained in step 120 are combined with the values describing a candidate use environment, to look up, in database 118, the target property values for the combination. Again, if the specific intermediate property values or the specific use environment are not exactly represented in database 118, then two or more similar combinations can be looked up in the database 118, and their pre-calculated target property values can be combined to predict the target property values of the particular combination under consideration. Again, the combination of target property values can involve interpolation or a more complex or intelligent mechanism in various embodiments.

FIG. 1 also shows an optional step 140 for further evaluation of materials and use environments, using a parallel flow 145. The parallel flows includes developing individual process steps for manufacturing the integrated circuit, using various materials to be used in the fabrication of the device as input, including one or more identified or characterized materials using the steps of FIG. 1. The parallel flow is further described in a section for Parallel Flow.

The database 124 are stored on one or more non-transitory computer readable media. As used herein, no distinction is intended between whether a database is disposed "on" or "in" a computer readable medium. Additionally, as used herein, the term "database" does not necessarily imply any unity of structure. For example, two or more separate databases, when considered together, still constitute a "database" as that term is used herein. Thus in FIG. 1, the databases 114 and 118 are also sometimes referred to herein in combination as database 124.

Figure 2:
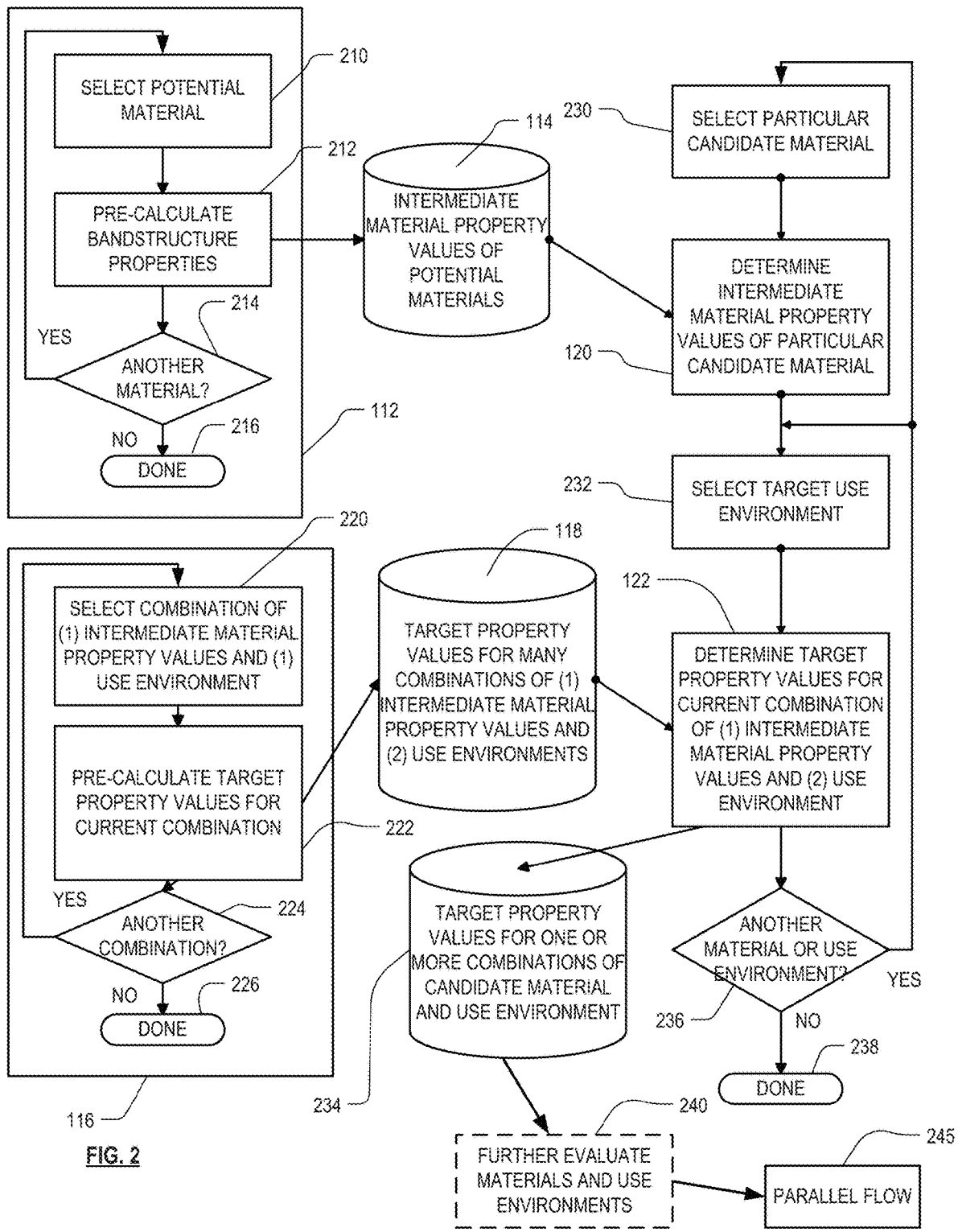
FIG. 2 is a flow chart illustrating another view of an embodiment of the invention.

FIG. 2 is a flow chart illustrating another view of an embodiment of the invention. Steps 112, 116, 120 and 122 of FIG. 1 are shown in FIG. 2, as are the databases 114 and 118.

FIG. 2 shows a detail of one embodiment of step 112, for pre-calculating intermediate material property values of various potential materials. In step 210, a potential material is selected for characterizing. In step 212, band structure properties such as Eg and m* are calculated for the selected potential material and written into database 114. An ab-initio modeling tool can be used for this purpose, such as a DFT tool. An example tool that can be used for this purpose is the Vienna Ab-initio Simulation Package, described in the document *VASP the Guide*, written by Georg Kresse, et al., Computational Physics, Faculty of Physics, Universität Wien, Sensengasse 8, A-1130 Wien, Austria, incorporated by reference herein. The document *VASP the Guide* can be retrieved from http (colon slash slash) cms (dot) mpi (dot) univie (dot) ac (dot) at/VASP/. Another embodiment for different intermediate properties can use a different modeling tool, such as an NEGF modeling tool. See the above incorporated U.S. Provisional Application Nos. 61/883,158 and 61/883,942. In step 214, it is determined whether another potential material is to be characterized. If so, then the method loops back to step 210 to characterize the next potential material. Preferably a large number of materials are characterized in this way, the more the better. However, the number may be limited given the very large cost of each pre-calculation.

FIG. 2 also shows a detail of one embodiment of step 116, for pre-calculating target property values for a variety of combinations of (1) intermediate material property values and (2) use environments. In step 220, values are selected for intermediate material property values (E.g. Eg and m* in one embodiment), and for a use environment (e.g. a technology node or a stress tensor). In step 222, the target property values are calculated for the selected combination and written into database 118. In an embodiment, a TCAD (Technology Computer Aided Design) tool can be used for this purpose, such as Sentaurus Device, available from Synopsys, Inc., or the TCAD tool described in Stephen E. Hansen, SUPREM-III User's Manual, Version 8628 (1986). In step 224 it is determined whether to calculate the target property values for another combination. If so, then the method loops back to step 220 to consider the next combination of values. If not, then the method ends (step 226). Preferably a large number of combinations are considered in this way, the more the better. However, the number may be limited given the large cost of each pre-calculation.

FIG. 2 also shows a flow chart for finding a material or materials that optimize the target property values in various use environments. In step 230, a particular candidate material is selected. In step 120 its intermediate material property values are obtained using the database 114, as set forth above with respect to FIG. 1. In step 232 values are selected for a candidate target use environment. In step 122 these values, in combination with the intermediate material property values obtained in step 120, are used to obtain target property values by reference to the database 118, as previously described with respect to FIG. 1. The resulting target property values are written into a database 234 in association with the combination of candidate material from step 230 and use environment from step 232. Alternatively, they can be reported perceptibly to a user.

In step 236 it is determined whether target property values are desired for another material and/or use environment combination. If so, and only the use environment is to change, then the routine loops back to step 232 to select the next target use environment. If the candidate material is to change, then the routine loops back to step 230 to select the next candidate material. If no further target property values are desired at this time, then the routine ends (step 238).

FIG. 2 also shows an optional step 240 for further evaluation of materials and use environments, using a parallel flow 245. The parallel flows includes developing individual process steps for manufacturing the integrated circuit, using various materials to be used in the fabrication of the device as input, including one or more identified or characterized materials using the steps of FIG. 2. The parallel flow is further described in a section for Parallel Flow.

FURTHER EMBODIMENTS

If the methodology of FIG. 1 is used to screen candidate materials for gate stack leakage, then the intermediate properties might include gate dielectric band gap band offsets for the conduction and valence bands for n- and p-type transistors. If the methodology of FIG. 1 is used to screen candidate materials for other transistor figures of merit such as drive current strength or switching speed, then the intermediate properties might include such properties as injection velocity, ballisticity, surface roughness scattering, and uniformity of material; and the description of the use environment might include such values as the bias conditions. Many other embodiments will be apparent to the reader.

Analysis Tools

In one embodiment, all of the steps 112, 116, 120, and 122, and optionally 230, 232 and 236, can be implemented in a single analysis tool. The analysis tool takes as input each of the relevant input parameters described above for the functions performed, performs the operations described above using such input parameters, and produces one or more outputs. Preferably the output values are written to database 234 and used to select a material to investigate further and/or eventually use in the fabrication of integrated circuit devices.

In one embodiment, an analysis tool is provided that performs only step 112.

In one embodiment, an analysis tool is provided that performs only step 116.

In one embodiment, an analysis tool is provided that performs only steps 112 and 116.

In one embodiment, an analysis tool is provided that performs only steps 230 and 120 (and optionally 236) (FIG. 2), with the database 114 previously prepared, and writes the results to a separate database.

In one embodiment, an analysis tool is provided that performs only steps 232 and 122 (and optionally 236), with a single provided set of intermediate material property values and with the database 118 previously prepared.

In one embodiment, an analysis tool is provided that performs steps 230-122 (and optionally 236) (FIG. 2), with the databases 114 and 118 previously prepared.

In other embodiments analysis tools are provided with various other combinations of the functions of FIG. 1 or FIG. 2.

Hardware Implementation

Figure 3:
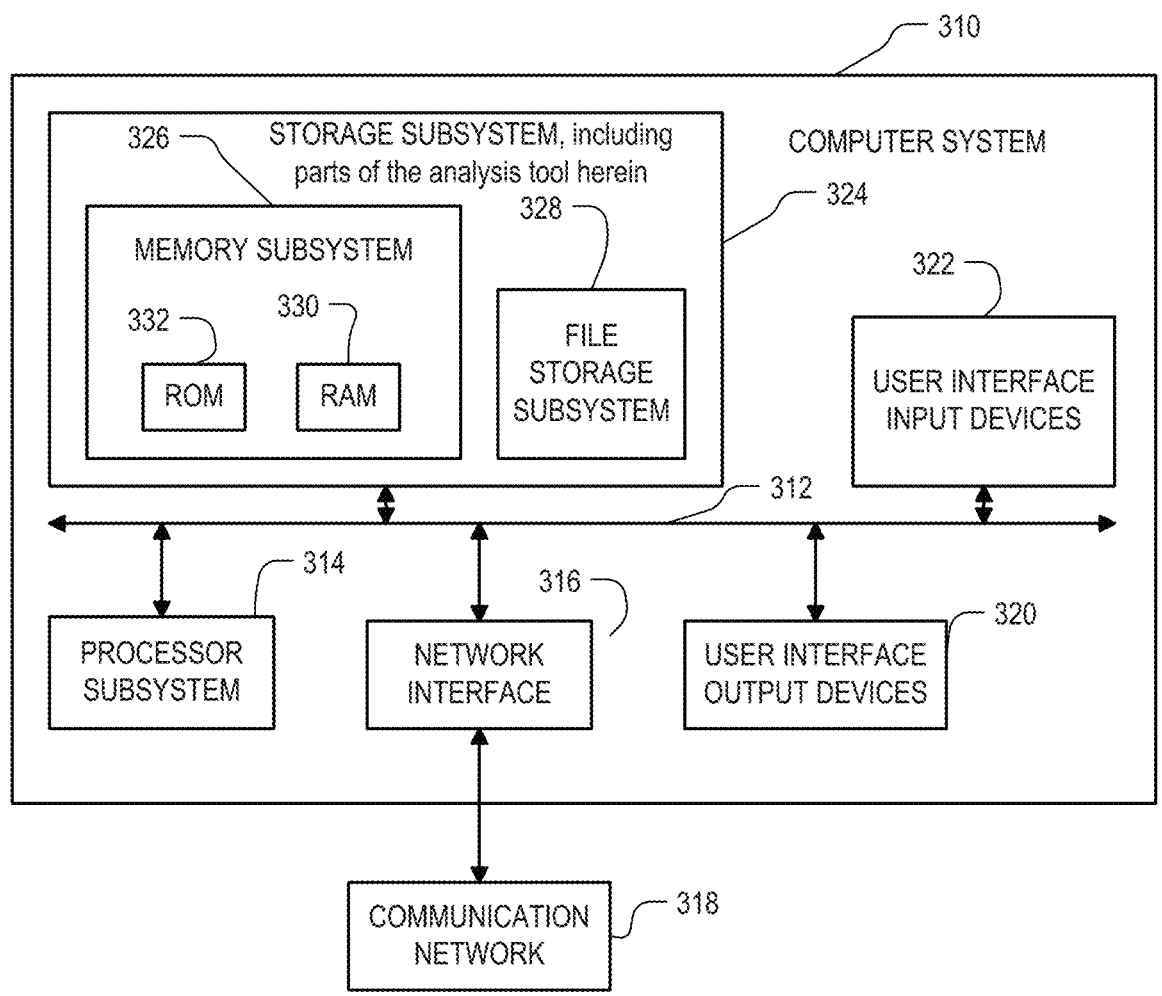
FIG. 3 is a simplified block diagram of a computer system that can be used to implement any of the methods and processes herein.

FIG. 3 is a simplified block diagram of a computer system 310 that can be used to implement any of the methods and processes herein. Particularly it can be used to implement steps 112, 116, 230, 120, 232, 122 and/or 236 in various embodiments, as well as the analysis tool as described herein. It also includes or accesses the database(s) 114, 118 and/or 234. Aspects of step 110 can be performed using a computer system 310 as well.

Computer system 310 typically includes a processor subsystem 314 which communicates with a number of peripheral devices via bus subsystem 312. These peripheral devices may include a storage subsystem 324, comprising a memory subsystem 326 and a file storage subsystem 328, user interface input devices 322, user interface output devices 320, and a network interface subsystem 316. The input and output devices allow user interaction with computer system 310. Network interface subsystem 316 provides an interface to outside networks, including an interface to communication network 318, and is coupled via communication network 318 to corresponding interface devices in other computer systems. Communication network 318 may comprise many interconnected computer systems and communication links. These communication links may be wireline links, optical links, wireless links, or any other mechanisms for communication of information, but typically it is an IP-based communication network. While in one embodiment, communication network 318 is the Internet, in other embodiments, communication network 318 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 322 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 310 or onto computer network 318.

User interface output devices 320 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 310 to the user or to another machine or computer system. Target property values determined by embodiments of the system as described herein may be reported to a user via one or more of the output devices 320.

Storage subsystem 324 stores the basic programming and data constructs that provide the functionality of certain embodiments of the present invention. For example, the various modules implementing the functionality of certain embodiments of the invention may be stored in storage subsystem 324. These software modules are generally executed by processor subsystem 314. The database(s) 114, 118 and/or 234 may reside in non-transitory computer readable media in storage subsystem 324.

Memory subsystem 326 typically includes a number of memories including a main random access memory (RAM) 330 for storage of instructions and data during program execution and a read only memory (ROM) 332 in which fixed instructions are stored. File storage subsystem 328 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 328. The host memory 326 contains, among other things, computer instructions which, when executed by the processor subsystem 314, cause the computer system to operate or perform functions as described herein. As used herein, processes and software that are said to run in or on "the host" or "the computer", execute on the processor subsystem 314 in response to computer instructions and data in the host memory subsystem 326 including any other local or remote storage for such instructions and data.

Bus subsystem 312 provides a mechanism for letting the various components and subsystems of computer system 310 communicate with each other as intended. Although bus subsystem 312 is shown schematically as a single bus, alternative embodiments of the bus subsystem may use multiple busses.

Computer system 310 itself can be of varying types including a personal computer, a portable computer, a workstation, a computer terminal, a network computer, a television, a mainframe, a server farm, or any other data processing system or user device. Due to the ever changing nature of computers and networks, the description of computer system 310 depicted in FIG. 3 is intended only as a specific example for purposes of illustrating the preferred embodiments of the present invention. Many other configurations of computer system 310 are possible having more or less components than the computer system depicted in FIG. 3.

In addition, while the present invention has been described in the context of a fully functioning data processing system, those of ordinary skill in the art will appreciate that the processes herein are capable of being distributed in the form of a computer readable medium of instructions and data and that the invention applies equally regardless of the particular type of signal bearing media actually used to carry out the distribution. As used herein, a computer readable medium is one on which information can be stored and read by a computer system. Examples include a floppy disk, a hard disk drive, a RAM, a CD, a DVD, flash memory, a USB drive, and so on. The computer readable medium may store information in coded formats that are decoded for actual use in a particular data processing system. A single computer readable medium, as the term is used herein, may also include more than one physical item, such as a plurality of CD ROMs or a plurality of segments of RAM, or a combination of several different kinds of media. As used herein, the term does not include mere time varying signals in which the information is encoded in the way the signal varies over time.

Overall Design Process Flow

Figure 4:
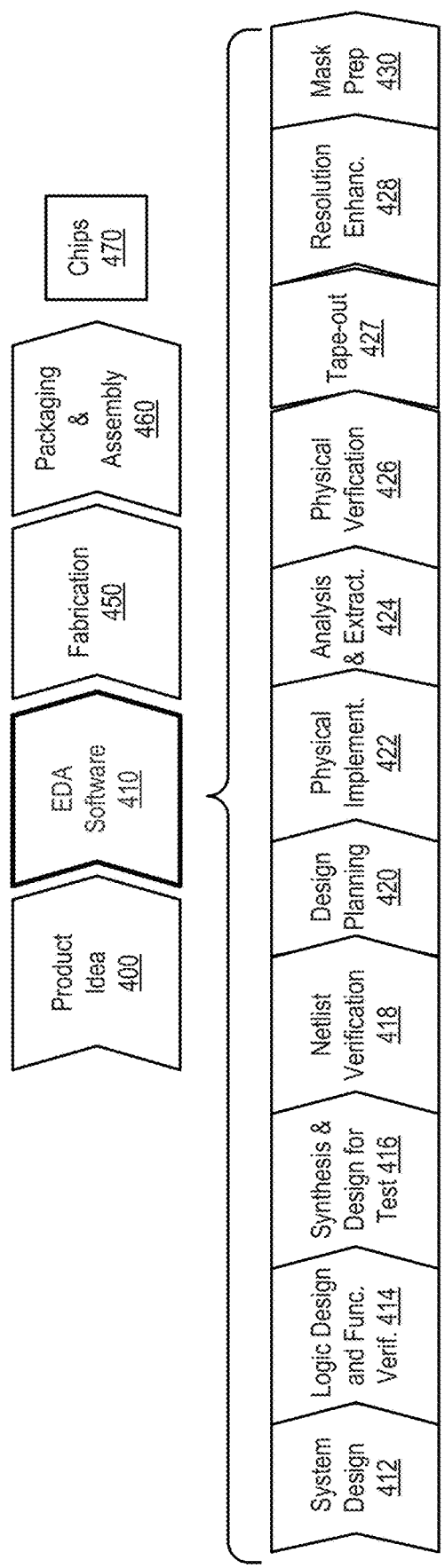
FIG. 4 shows a simplified representation of an illustrative digital integrated circuit design flow incorporating features of the technology.

Aspects of the invention can further include an integrated circuit design flow, for creating layouts and fabricating masks and/or integrated circuit devices which use one or more materials considered in FIGS. 1 and 2. FIG. 4 shows a simplified representation of an illustrative digital integrated circuit design flow, applicable for each of the chips 412 and 414 in the 3DIC. At a high level, the process starts with the product idea (step 400) and is realized in an EDA (Electronic Design Automation) software design process (step 410). When the design is finalized, it can be taped-out (step 427). At some point after tape out, the fabrication process (step 450) and packaging and assembly processes (step 460) occur resulting, ultimately, in finished integrated circuit chips (result 470).

The EDA software design process (step 410) is itself composed of a number of steps 412-430, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 410) will now be provided.

System design (step 412): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 414): At this stage, the VHDL or Verilog code for modules in the system is written and the design is checked for functional accuracy. More specifically, the design is checked to ensure that it produces correct outputs in response to particular input stimuli. Example EDA software products from Synopsys, Inc. that can be used at this step include VCS, VERA, DesignWare®, Magellan, Formality, ESP and LEDA products.

Synthesis and design for test (step 416): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and DesignWare® products.

Netlist verification (step 418): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 420): Here, an overall floor plan for the chip is constructed and analyzed for timing and top-level routing. Example EDA software products from Synopsys, Inc. that can be used at this step include Astro and Custom Designer products.

Physical implementation (step 422): The placement (positioning of circuit elements) and routing (connection of the same) occurs at this step, as can selection of library cells to perform specified logic functions. Example EDA software products from Synopsys, Inc. that can be used at this step include the Astro, IC Compiler, and Custom Designer products.

Analysis and extraction (step 424): At this step, the circuit function is verified at a transistor level, this in turn permits what-if refinement. Example EDA software products from Synopsys, Inc. that can be used at this step include AstroRail, PrimeRail, PrimeTime, and Star-RCXT products.

Physical verification (step 426): At this step various checking functions are performed to ensure correctness for: manufacturing, electrical issues, lithographic issues, and circuitry. Example EDA software products from Synopsys, Inc. that can be used at this step include the Hercules product.

Tape-out (step 427): This step provides the "tape out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 428): This step involves geometric manipulations of the layout to improve manufacturability of the design. Example EDA software products from Synopsys, Inc. that can be used at this step include Proteus, ProteusAF, and PSMGen products.

Mask data preparation (step 430): This step provides mask-making-ready "tape-out" data for production of masks for lithographic use to produce finished chips. Example EDA software products from Synopsys, Inc. that can be used at this step include the CATS® family of products. The method for actually making the masks can use any mask making technique, either known today or developed in the future. As an example, masks can be printed using techniques set forth in U.S. Pat. Nos. 6,096,458; 6,057,063; 5,246,800; 5,472,814; and 5,702,847, all incorporated by referenced herein for their teachings of mask printing techniques.

Parallel Flow. Aspects of the invention can further include a parallel flow (e.g. 145, FIG. 1; 245, FIG. 2), as follows:

(1) Develop individual process steps for manufacturing the integrated circuit. This can be modeled with EDA tools such as the Synopsys tools "Sentaurus Process", "Sentaurus Topography", and "Sentaurus Lithography". The input information here is the various materials to be used in the fabrication of the device, including one or more identified or characterized using the steps of FIGS. 1 and 2. The input information also includes process conditions like temperature, reactor ambient, implant energy, etc. The output information is the change in geometry or doping profiles or stress distribution.

(2) Integrate the individual process steps into the complete process flow. This can be modeled with EDA tools such as the Synopsys tool "Sentaurus Process". The input information here is the collection of the process steps in the appropriate sequence. The output is the geometry, the doping profiles, and the stress distribution for the transistors and the space in between the transistors.

(3) Analyze performance of the transistor manufactured with this process flow. This can be done with EDA tools such as the Synopsys tool "Sentaurus Device". The input information here is the output of step (2) and the biases applied to transistor terminals. The output information is the currents and capacitances for each bias combination.

(4) If necessary, modify the process steps and the process flow, the target use environment and/or the material as in FIG. 2, to achieve the desired transistor performance. This can be done iteratively by using tools such as the Synopsys tools as described above.

Once the process flow is ready, it can be used for manufacturing multiple circuit designs coming from different fabless companies, using one or more materials identified or characterized using the steps of FIGS. 1 and 2. The EDA flow 412-430 will be used by such fabless companies. The parallel flow described here is used at a foundry to develop a process flow that can be used to manufacture designs coming from their fabless customers. A combination of the process flow and the masks 430 are used to manufacture any particular circuit. If the integrated circuit is manufactured at an IDM (integrated device manufacturer) company instead of the combination of a fables company and a foundry, then both parallel flows described above are done at the same IDM company.

There is also a bridge between these tools and the 412-430 EDA tools. The bridge can be an EDA tool a Synopsys tool "Seismos" that applies compact proximity models for particular circuit design and layout to obtain netlist with instance parameters for each individual transistor in the circuit as a function of its neighborhood and stress, including material conversion stress.

The following documents provide additional information about terms and components as used in the present specification, and are incorporated by reference herein:

Synopsys, Sentaurus TCAD, Datasheet (2012);

Stephen E. Hansen, SUPREM-III User's Manual, Version 8628 (1986), available from http (colon slash slash) www-tcad.stanford.edu/tcad/programs/suprem3man.pdf (visited 14 Oct. 2013);

ITRS, International Technology Roadmap For Semiconductors—2012 Update Overview (2012), available at http (colon slash slash) www (dot) itrs (dot) net/Links/2012ITRS/2012Chapters/2012Overview.pdf, visited 14 Oct. 2013;

ITRS, 2012 Overall Roadmap Technology Characteristics (ORTC) Tables (2012, available at http (colon slash slash) www (dot) itrs (dot) net/Links/2012ITRS/2012Tables/ORTC_2012Tables.xlsm, visited 14 Oct. 2013;

Materials attached as appendices to the above-incorporated provisional patent applications are also incorporated by reference herein:

LUISIER M., Quantum Transport Beyond the Effective Mass Approximation, dissertation (2007), which among other things describes the Non-Equilibrium Green's Function (NEGF);

BURKE, K., et al., "The ABC of DFT" (2007), which among other things describes DFT; and KRESSE, G., et. al., VASP the Guide (Sep. 9, 2013), which among other things describes a package for performing ab-initio quantum-mechanical molecular dynamics (MD) simulations using pseudopotentials or the projector-augmented wave method and a plane wave basis set.

SANT, S. et. al., "Band Gap Bowing and Band Offsets in Related and Strained Si1-xGex Alloys by Employing a New Nonlinear Interpolation Scheme" (2013), *J. Appl. Phys.*, Vol. 113, 033708, pp. 1-11.

CSANYI et al., U.S. Patent Application Publication No. 2011/0161361, published Jun. 30, 2011.

S. Uppal, et. al., J. Appl. Phys., v. 96, No. 3, pp. 1376-1380 (2004)

Y. M. Haddaraa, et. al., Appl. Phys. Letters, v. 77, No. 13, pp. 1976-1978 (2000)

S. Uppal, et. al., J. Appl. Phys., v. 90, No. 8, pp. 4293-4295 (2001)

SOME PARTICULAR EMBODIMENTS

One embodiment of the technology disclosed is a method for evaluating candidate materials for fabrication of integrated circuits. The method includes determining a set of at least one intermediate material property for a material, where intermediate material properties in the set affect a target property, but are substantially unaffected by the environment in which the material is to be used. The method further includes pre-calculating values of the intermediate material property(s) for a plurality of potential materials and writing the values to a first database. Additional embodiments of the technology disclosed include corresponding systems, and computer readable media.

These and additional embodiments can include one or more of the following features. In another embodiment, the method includes determining a set of at least one intermediate material property for a material, where intermediate material properties in the set affect a target property, but are substantially unaffected by the environment in which the material is to be used. The method further includes pre-calculating values of the target property for a plurality of combinations of (1) values for the intermediate material property(s) and (2) values describing environments in which the material may be used, and writing the values to a second database.

In yet another embodiment, the method includes determining a set of at least one intermediate material property for a material, where intermediate material properties in the set affect a target property, but are substantially unaffected by the environment in which the material is to be used. The method further includes pre-calculating values of the intermediate material property(s) for a plurality of potential materials and writing the values to a first database, and pre-calculating values of the target property for a plurality of combinations of (1) values for the intermediate material property(s) and (2) values describing environments in which the material may be used, and writing the values to a second database.

In some embodiments, the method is for use with a first database relating value(s) of intermediate material property(s) with a plurality of potential materials, and for use further with a second database relating values of a target property with a plurality of combinations of (1) values for the intermediate material property(s) and (2) values describing environments in which the material may be used. For a particular candidate material and a particular environment in combination, the method includes determining value(s) of the intermediate property for the candidate material by reference to the first database, and determining the value of the target property for the particular candidate material by querying the second database with, in combination, (1) the determined intermediate property value(s) of the particular candidate material and (2) value(s) describing the particular environment.

In some other embodiments, the method includes determining a set of at least one intermediate material property for a material, where intermediate material properties in the set affect a target property, but are substantially unaffected by the environment in which the material is to be used. The method further includes pre-calculating values of the intermediate material property(s) for a plurality of potential materials and writing the values to a first database, and pre-calculating values of the target property for a plurality of combinations of (1) values for the intermediate material property(s) and (2) values describing environments in which the material may be used, and writing the values to a second database. For a particular candidate material and a particular environment in combination, the method of these embodiments further includes determining value(s) of the intermediate property for the candidate material by reference to the first database, and determining the value of the target property for the particular candidate material by querying the second database with, in combination, (1) the determined intermediate property value(s) of the particular candidate material and (2) value(s) describing the particular environment.

In a method according to any embodiment described herein, the intermediate material property(s) may include Eg (bandgap energy) and/or m* (effective mass), and the target property may be BTBT (band-to-band tunneling) and/or DSDT (direct source-to-drain tunneling).

In a method according to any embodiment described herein, pre-calculating and writing to a first database may include use of an ab-initio modeling tool such as a DFT (density functional theory) tool, and pre-calculating and writing to a second database may include using a TCAD modeling tool.

In a method according to any embodiment described herein, the values describing the particular environment may include aspects of a design rule database.

In a method according to any embodiment described herein, if the intermediate property for the particular candidate material is not characterized in the first database, then determining value(s) of the intermediate property for the candidate material may include combining value(s) of the intermediate property(s) of two or more materials that are characterized in the first database.

In a method according to any embodiment described herein, if the combination of (1) the determined intermediate property value(s) of the particular candidate material and (2) value(s) describing the particular environment is not characterized in the second database, then determining the value of the target property for the particular candidate material may include combining the value(s) of the target property(s) of two or more combinations of (1) intermediate property value(s) and (2) value(s) describing environment(s) in which the material may be used, which combinations are characterized in the second database.

One embodiment of the technology disclosed is an analysis tool that includes a data processor and a memory coupled to the data processor. The data processor is configured with a program interface that includes a plurality of procedures executable using a set of input parameters, and produces results useful in choosing a material for the fabrication of integrated circuits. The procedures are responsive to input parameters including one or more of: an identification of a potential material, an identification of values for the intermediate material property(s), values describing environments in which a candidate material may be used, a database identifying intermediate material property values for a variety of potential materials, a database identifying target property values for a variety of combinations of (1) intermediate material property values and (2) use environments, identification of a candidate material, the intermediate material property values of a particular candidate material, and a particular target use environment. The procedures are responsive to the input parameters to determine one or more of: intermediate property values of one or more potential materials, target property values for one or more combinations of (1) intermediate material property values and (2) use environments, intermediate material property values of a particular candidate material, and target property values for one or more combinations of (1) a particular candidate material and (2) a particular use environment. The data processor writes the output(s) of the procedures to a data store which is part of and/or accessible to the data processor.

One embodiment of the technology disclosed includes a database including a first database and a second database. The first database is stored on a non-transitory computer readable medium and relates value(s) of the intermediate material property(s) with a plurality of potential materials. The second database is stored on a non-transitory computer readable medium, and relates values of the target property with a plurality of combinations of (1) values for the intermediate material property(s) and (2) values describing environments in which the material may be used.

As mentioned above, the technology disclosed may be implemented in a system for evaluating candidate materials for fabrication of integrated circuits. The system includes one or more processor configured to perform operations implementing methods as described herein and any of the features and optional embodiments of the methods described.

As mentioned above, the technology disclosed may be implemented in non-transitory computer readable medium storing computer instructions for evaluating candidate materials for fabrication of integrated circuits. The non-transitory computer readable medium includes actions to implement methods as described herein and any of the features and optional embodiments of the methods described.

As used herein, a given event or value is "responsive" to a predecessor event or value if the predecessor event or value influenced the given event or value. If there is an intervening processing element, step or time period, the given event or value can still be "responsive" to the predecessor event or value. If the intervening processing element or step combines more than one event or value, the signal output of the processing element or step is considered "responsive" to each of the event or value inputs. If the given event or value is the same as the predecessor event or value, this is merely a degenerate case in which the given event or value is still considered to be "responsive" to the predecessor event or value. "Dependency" of a given event or value upon another event or value is defined similarly.

As used herein, the "identification" of an item of information does not necessarily require the direct specification of that item of information. Information can be "identified" by simply referring to the actual information through one or more layers of indirection, or by identifying one or more items of different information which are together sufficient to determine the actual item of information. In addition, the term "indicate" is used herein to mean the same as "identify".

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features.

In particular and without limitation, though many of the inventive aspects are described individually herein, it will be appreciated that many can be combined or used together with each other. All such combinations are intended to be included in the scope of this document.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated.

The invention claimed is:

1. A method for fabricating an integrated circuit comprising:

providing a computer system with a first database relating each of a plurality of materials for an integrated circuit, with corresponding values for intermediate material properties including bandgap Eg and/or effective mass m*, each of the intermediate material properties being properties which are unaffected by the integrated circuit environment in which the material is used;

providing the computer system a second database relating each of a plurality of combinations of values for the intermediate properties and values describing potential environments for the material in an integrated circuit, with corresponding target material properties including Band-To-Band Tunneling (BTBT) and Direct Source-to-Drain Tunneling (DSDT);

for each of a plurality of candidate materials, the computer system determining values for each of the intermediate material properties by querying the first database;

for each of a plurality of candidate integrated circuit environments, the computer system determining a plurality of target property values of the target property for each particular one of the candidate materials by querying the second database with, in combination, (a) the determined values for the intermediate material properties for the candidate material and (b) values describing each of the candidate integrated circuit environments; and fabricating an integrated circuit device using a selected one of the candidate materials selected in dependence upon the plurality of target property values, and a provided layout.

2. The method of claim 1, wherein a particular one of the intermediate properties for a particular one of the candidate materials is not characterized in the first database, and wherein determining a value for the particular intermediate material property comprises combining the value of the intermediate property for at least two materials that are characterized in the first database.

3. The method of claim 1, wherein the combination of (a) the determined values for a particular one of the intermediate material properties for a particular one of the candidate materials and (b) values describing a particular one of the candidate integrated circuit environments, is not characterized in the second database, and wherein determining a plurality of target property values of the target property for the particular candidate material comprises combining the values of the target properties for at least two combinations of (a) values for the intermediate material properties for candidate materials and (b) values describing candidate environments, which combinations are characterized in the second database.

4. The method of claim 1, wherein the values describing candidate integrated circuit environments include aspects of a design rule database.

5. The method of claim 1, further comprising identifying the selected candidate material as one of the candidate materials having a combination of target property values considered to optimize a combination of transistor performance characteristics including members of the group consisting of driving current strength, switching speed, capacitance, reliability, variability, leakage current, and power consumption.

6. A computer readable medium having stored thereon in a non-transitory manner:

a first database relating each of a plurality of materials for an integrated circuit, with corresponding values for intermediate material properties including bandgap Eg and/or effective mass m*, each of the intermediate material properties being properties which are unaffected by the integrated circuit environment in which the material is used;

a second database relating each of a plurality of combinations of values for the intermediate properties and values describing potential environments for the material in an integrated circuit, with corresponding target material properties including Band-To-Band Tunneling (BTBT) and Direct Source-to-Drain Tunneling (DSDT); and a plurality of software code portions defining logic for:

for each of a plurality of candidate materials, determining values for each of the intermediate material properties by querying the first database;

for each of a plurality of candidate integrated circuit environments, determining a plurality of target property values of the target property for each particular one of the candidate materials by querying the second database with, in combination, (a) the determined values for the intermediate material properties for the candidate material and (b) values describing each of the candidate integrated circuit environments; and developing an integrated circuit device using a selected one of the candidate materials selected in dependence upon the plurality of target property values, and a provided layout.

7. The medium of claim 6, wherein a particular one of the intermediate properties for a particular one of the candidate materials is not characterized in the first database, and wherein determining a value for the particular intermediate material property comprises combining the value of the intermediate property for at least two materials that are characterized in the first database.

8. The medium of claim 6, wherein the combination of (a) the determined values for a particular one of the intermediate material properties for a particular one of the candidate materials and (b) values describing a particular one of the candidate integrated circuit environments, is not characterized in the second database, and wherein determining a plurality of target property values of the target property for the particular candidate material comprises combining the values of the target properties for at least two combinations of (a) values for the intermediate material properties for candidate materials and (b) values describing candidate environments, which combinations are characterized in the second database.

9. The medium of claim 6, wherein the values describing candidate integrated circuit environments include aspects of a design rule database.

10. The medium of claim 6, further comprising identifying the selected candidate material as one of the candidate materials having a combination of target property values considered to optimize a combination of transistor performance characteristics including members of the group consisting of driving current strength, switching speed, capacitance, reliability, variability, leakage current, and power consumption.

11. A system for fabricating an integrated circuit,
for use with a first database relating each of a plurality of materials for an integrated circuit, with corresponding values for intermediate material properties including bandgap Eg and/or effective mass m*, each of the intermediate material properties being properties which are unaffected by the integrated circuit environment in which the material is used,
for use further with a second database relating each of a plurality of combinations of values for the intermediate properties and values describing potential environments for the material in an integrated circuit, with corresponding target material properties including Band-To-Band Tunneling (BTBT) and Direct Source-to-Drain Tunneling (DSDT), the system comprising:
a memory;
a data processor coupled to the memory, the data processor configured to:
  for each of a plurality of candidate materials, determine values for each of the intermediate material properties by querying the first database;
  for each of a plurality of candidate integrated circuit environments, determine a plurality of target property values of the target property for each particular one of the candidate materials by querying the second database with, in combination, (a) the determined values for the intermediate material properties for the candidate material and (b) values describing each of the candidate integrated circuit environments; and
  develop an integrated circuit device using a selected one of the candidate materials selected in dependence upon the plurality of target property values, and a provided layout.

12. The system of claim 11, wherein a particular one of the intermediate properties for a particular one of the candidate materials is not characterized in the first database,
  and wherein determining a value for the particular intermediate material property comprises combining the value of the intermediate property for at least two materials that are characterized in the first database.

13. The system of claim 11, wherein the combination of (a) the determined values for a particular one of the intermediate material properties for a particular one of the candidate materials and (b) values describing a particular one of the candidate integrated circuit environments, is not characterized in the second database,
  and wherein determining a plurality of target property values of the target property for the particular candidate material comprises combining the values of the target properties for at least two combinations of (a) values for the intermediate material properties for candidate materials and (b) values describing candidate environments, which combinations are characterized in the second database.

14. The system of claim 11, wherein the values describing candidate integrated circuit environments include aspects of a design rule database.

15. The system of claim 11, wherein the data processor configured to identify the selected candidate material as one of the candidate materials having a combination of target property values considered to optimize a combination of transistor performance characteristics including members of the group consisting of driving current strength, switching speed, capacitance, reliability, variability, leakage current, and power consumption.

* * * * *